US005877638A

United States Patent [19]
Lin

[11] Patent Number: 5,877,638
[45] Date of Patent: Mar. 2, 1999

[54] OUTPUT BUFFER WITH LOW NOISE AND HIGH DRIVE CAPABILITY

[75] Inventor: Yu-Chang Lin, Hsinchu, Taiwan

[73] Assignee: Mosel Vitelic, Inc., Taiwan

[21] Appl. No.: 718,117

[22] Filed: Sep. 18, 1996

Related U.S. Application Data

[63] Continuation of Ser. No. 447,367, May 23, 1995, abandoned.

[51] Int. Cl.$^6$ .................................................. H03K 17/04
[52] U.S. Cl. .......................... 327/108; 327/112; 327/389; 326/27
[58] Field of Search .................. 327/108, 110, 327/112, 111, 374, 376, 377, 379–385, 387–389, 391; 326/26, 27, 21, 83

[56] References Cited

U.S. PATENT DOCUMENTS

| | | | |
|---|---|---|---|
| 4,792,705 | 12/1988 | Ouyang et al. | 327/376 |
| 5,021,684 | 6/1991 | Ahuja et al. | 326/27 |
| 5,107,807 | 4/1992 | Kriz et al. | 326/27 |
| 5,237,213 | 8/1993 | Tanoi | 327/379 |
| 5,241,502 | 8/1993 | Lee et al. | 365/203 |
| 5,315,173 | 5/1994 | Lee et al. | 326/27 |
| 5,315,187 | 5/1994 | Cheng | 327/384 |
| 5,319,258 | 6/1994 | Ruetz | 327/379 |
| 5,355,029 | 10/1994 | Houghton et al. | 327/384 |
| 5,367,645 | 11/1994 | Lubeck et al. | 326/27 |
| 5,369,316 | 11/1994 | Chen et al. | 327/379 |
| 5,410,262 | 4/1995 | Kang | 327/379 |
| 5,414,379 | 5/1995 | Kwon | 327/389 |
| 5,420,525 | 5/1995 | Maloberti et al. | 327/380 |
| 5,430,335 | 7/1995 | Tanoi | 327/387 |
| 5,430,404 | 7/1995 | Campbell et al. | 327/379 |
| 5,450,356 | 9/1995 | Muller | 327/391 |
| 5,497,113 | 3/1996 | Uber | 326/27 |

FOREIGN PATENT DOCUMENTS

| | | | |
|---|---|---|---|
| 41 01 143 C1 | 4/1992 | Germany. | |
| 404035411 | 2/1992 | Japan | 327/374 |
| 9326091 | 12/1993 | WIPO | 326/27 |

OTHER PUBLICATIONS

Office Action, German Patent Office Jan. 22, 1996.

*Primary Examiner*—Tuan T. Lam
*Attorney, Agent, or Firm*—Townsend and Townsend and Crew LLP

[57] ABSTRACT

An output buffer with pull-up and push-down circuits. The pull-up circuits includes an initial voltage circuit providing an initial voltage to the pull-up terminal of the pull-up driver driving the output of the output buffer. The pull-up circuit also includes a circuit loop insuring that the ability of the pull-up circuit to drive the output terminal to the source voltage does not diminish in the latter half of the pull-up circuit's operation. The push-down circuit also insures that the drive capability of the push-down circuit does not diminish over the latter half of the push-down circuit's operation.

20 Claims, 8 Drawing Sheets

OUTPUT BUFFER WITH LOW NOISE AND HIGH DRIVE CAPABILITY

This is a Continuation of application Ser. No. 08/447,367, filed May 23, 1995, now abandoned.

BACKGROUND OF THE INVENTION

This invention relates to output buffers. In particular, this invention provides for improved speeds and reduced layout size and complexity in output buffers.

As shown in FIG. 1, output buffer 1 comprises pull-up transistor 102 and push-down transistor 104. Data input signal DI and output enable signal OE control the turning on and turning off of pull-up transistor 102 and push-down transistor 104. When output enable signal OE and data input signal DI are both high, pull-up transistor 102 is turned on and push-down transistor 104 is turned off. When output enable signal OE is high and data input signal DI is low, pull-up transistor 102 is turned off and push-down transistor 104 is turned on. The disadvantages of this circuit lie in that when pull-up transistor 102 (or push-down transistor 104) is turned on or off, serious current spikes often occur. The current spikes flow through the impedance and inductance component of the power source wires and the ground wire. Therefore, much noise is generated in the internal power source and the ground voltage. Too much noise may cause abnormal operation of the device—especially in the case of multi-output buffers.

To overcome the disadvantages of output buffer 1, another output buffer 2 has been developed as shown in FIG. 2. Pull-up element 202 includes three pull-up transistors 206, 208 and 210, connected in parallel, and push-down element 204 includes push-down transistors 212, 214 and 216, also connected in parallel. The turn-on and turn-off operation of the transistors is sequential, so the current spikes are effectively controlled. In VLSI circuitry, with respect to the output terminals of the general output buffer, the desired drive load ranges from tens of PFs to one hundred PFs. Thus, the width of the pull-up and push-down transistors are relatively large. Particularly with high-speed devices, the transistor width can range from hundreds of microns to one thousand microns. Pull-up transistor 202 and push-down transistor 204 in FIG. 2 include six transistors 206, 208, 210, 212, 214 and 216, each having a transistor width about one third of that of transistor 102 or transistor 104 in FIG. 1. Although this conventional output buffer can reduce the current spikes, the layout pattern is too complicated and the layout area is too large.

In addition, after a period of charge time in the pull-up element, the gate-to-source voltage $V_{GS}$ and the drain-to-source voltage will be smaller and smaller, resulting in a slower charge speed in the latter half of the charge time. Therefore, although this kind of output buffer circuit design improves the problem of the noise, the speed is still not satisfactory.

As shown in output buffer 3 of FIG. 3, pull-up element 302 includes two pull-up transistors 306 and 308, in parallel, and the push-down element includes two push-down transistors 310 and 312, also in parallel. The gate of pull-up transistor 306 is electrically connected to node 314 for receiving the normal turn-on voltage, and the gate of pull-up transistor 308 is electrically connected to bootstrap 316 for receiving a delayed turn-on voltage. This circuit can improve the problem of noise and fasten the charge speed, but due to the use of two pull-up transistors and two push-down transistors, the problems of a complicated layout and a large layout area still exist.

SUMMARY OF THE INVENTION

Accordingly, a goal of this invention is an output buffer with reduced or no current spikes when switched on or off, and in which the layout pattern is less complicated and the layout area smaller. Another goal of this invention is an output buffer with these characteristics and which nonetheless maintains its charging speed in the latter half of the charge period. This and other goals of the invention will be readily apparent to one of ordinary skill in the art on reading the above background and the disclosure below.

In one embodiment, the invention is an apparatus for buffering output, having a pull-up circuit and a push-down circuit. The pull-up circuit includes a pull-up driver circuit and an initial voltage circuit. The initial voltage circuit provides an initial voltage to the pull-up terminal of the pull-up driver circuit. With the voltage at the pull-up terminal set to an initial value, current spikes and noise in the operation of the apparatus are reduced. The initial voltage value can be less than or equal to the source voltage.

In another embodiment, the invention further includes a reference voltage circuit, a circuit for increasing the voltage on the pull-up terminal and a control circuit whose output controls the degree to which the voltage-increasing circuit causes the initial voltage circuit to increase the voltage at the pull-up terminal. The control circuit is responsive to the voltage on the pull-up terminal, completing a loop.

In still another embodiment, the invention is an apparatus for buffering output with a pull-up and push-down circuit. The push-down circuit has a push-down driver lowering the voltage at the output of the apparatus, an initial voltage circuit providing an initial voltage to the push-down terminal of the push-down driver, a signal delay circuit for delaying an ON signal fed into it, and a voltage-increasing circuit. The voltage-increasing circuit increases the voltage on the push-down terminal in response to the ON signal and increases the rate of the voltage increase in response to the delayed ON signal.

DESCRIPTION OF THE PREFERRED EMBODIMENT

In order to more clearly explain the operation of the present invention, we will discuss two applications of the invention separately: the high voltage source (5 V) application and the low voltage source (3.3 V) application.

Figure 4:
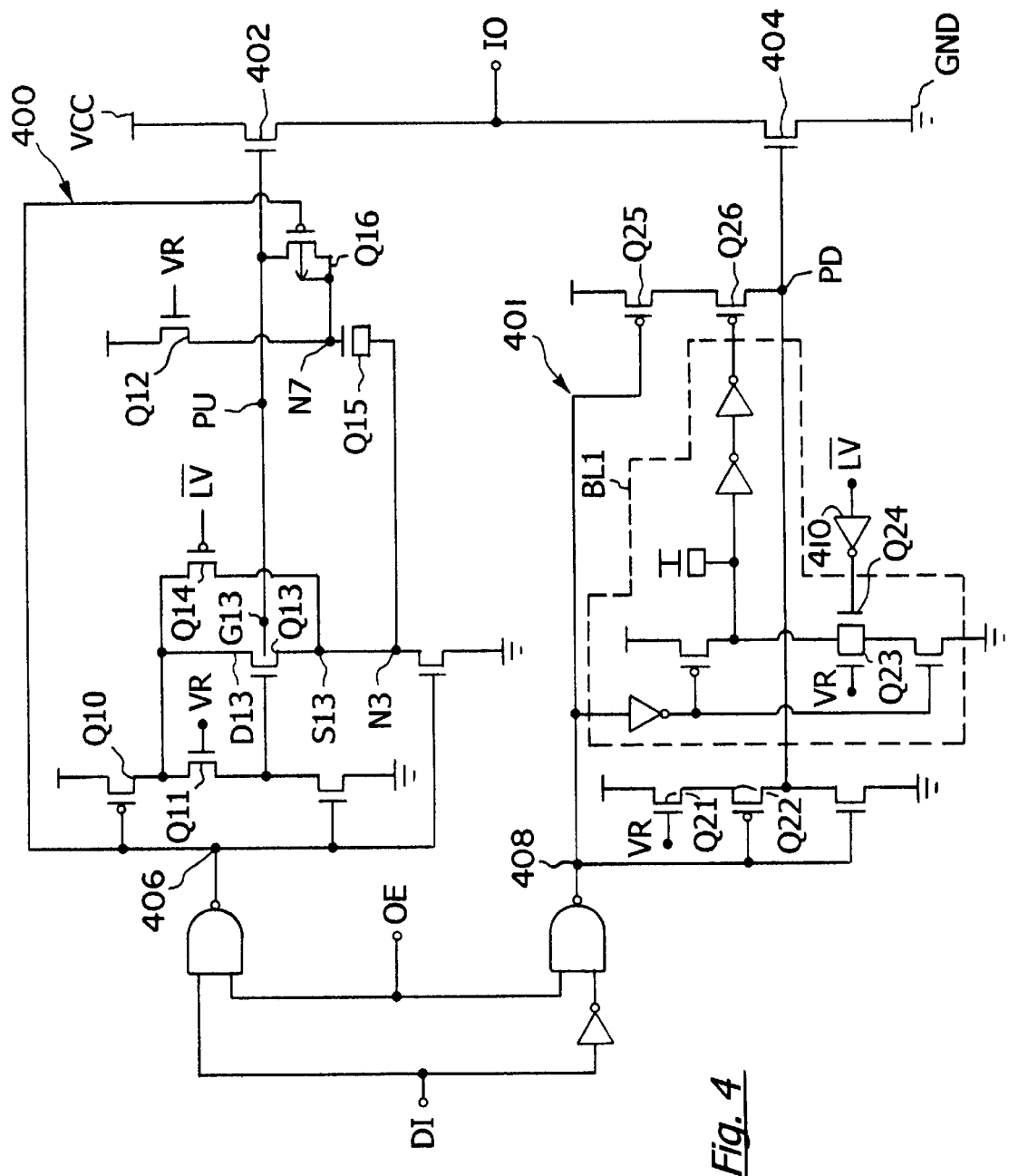
FIG. 4 shows the output buffer circuit of the present invention.
Figure 5:
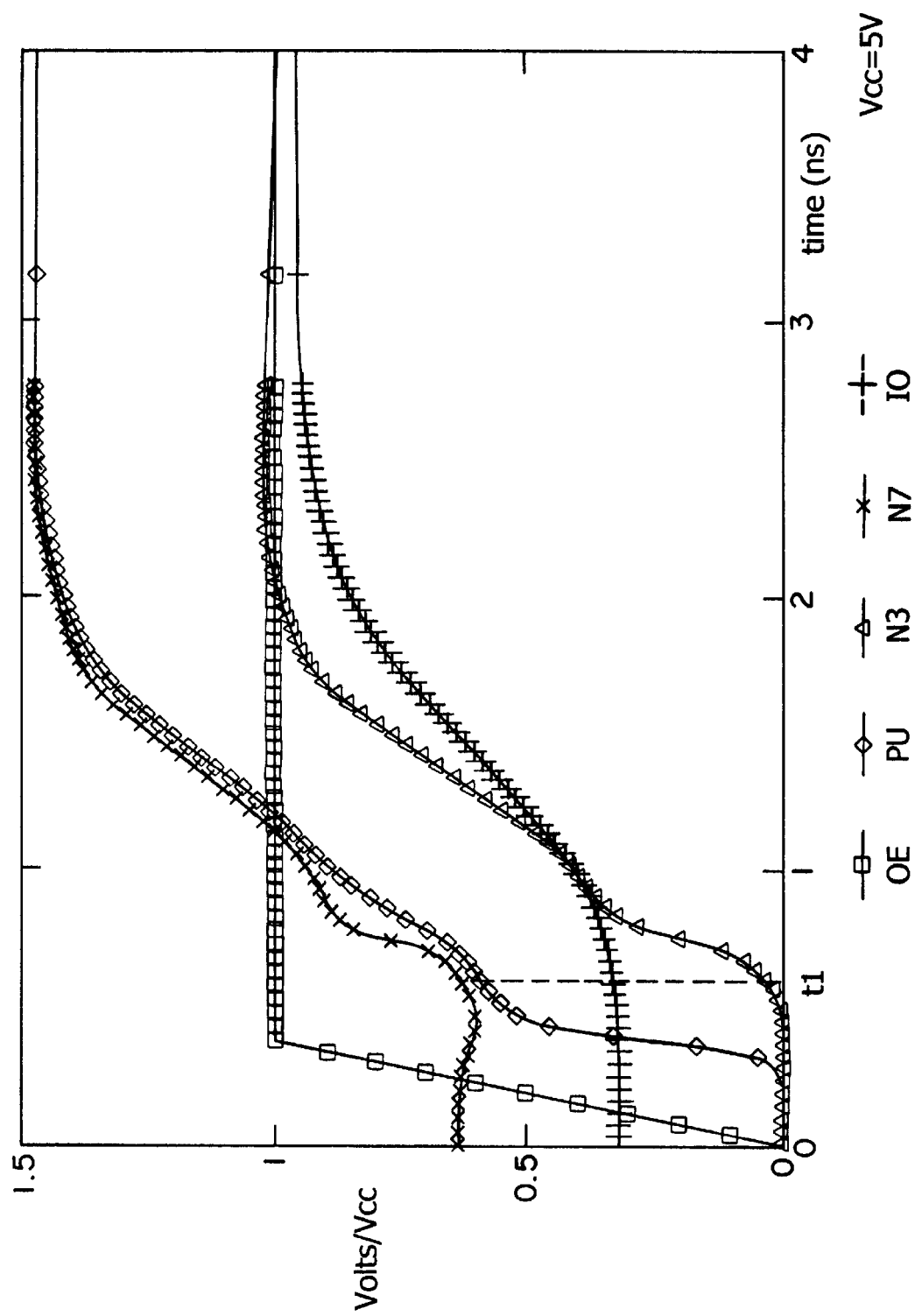
FIG. 5 shows the voltage-time diagram of OE, PU, N3, N7, IO curves of the present circuit when the power source is 5 V and the output is "1".

We discuss first the high voltage source application with output signal IO to be high. Referring to FIG. 4, pull-up transistor 402 is therefore turned on and push-down transistor 404 is turned off. When a voltage source of 5 V is applied, the gate voltage $\overline{LV}$ of PMOS transistor Q14 is high (logic level 1), and transistor Q14 is turned off. Voltage VR is a DC voltage resulting from a digital logic circuit and is designed at a proper level, usually smaller or equal to the voltage source (for example, 2 V≦VR≦5 V). Thus, when data input signal DI is high and output enable signal OE is high, transistors Q10, Q11, Q12, Q13 and Q16 are turned on, and pull-up terminal PU is charged to VR-V$_T$ through two paths: Q10, Q11 and Q12, Q16 (V$_T$ is the threshold voltage of transistors Q11 and Q12). At the same time, transistor Q13 is turned on, so voltage source V$_{CC}$ charges node N3, and the voltage at node N3 rises from 0 V. Thus, the voltage at node N7 is charged through capacitor Q15. By transistor Q16, the voltage at pull-up terminal PU increases, so transistor Q13 is turned on more, and the voltage at node N3 increases more. By this positive loop, the voltage at node N3 will increase continuously and dynamically until the voltage at drain D13 of transistor Q13 (which equals V$_{CC}$) and the voltage at source S13 of transistor Q13 are equal, and thus the transistor is turned off. At this time, the voltage at pull-up terminal PU reaches the desired value. FIG. 5 shows the voltage-time diagram of nodes OE, PU, N3, N7 and IO when a high voltage source is applied and the output is "1".

Figure 6:
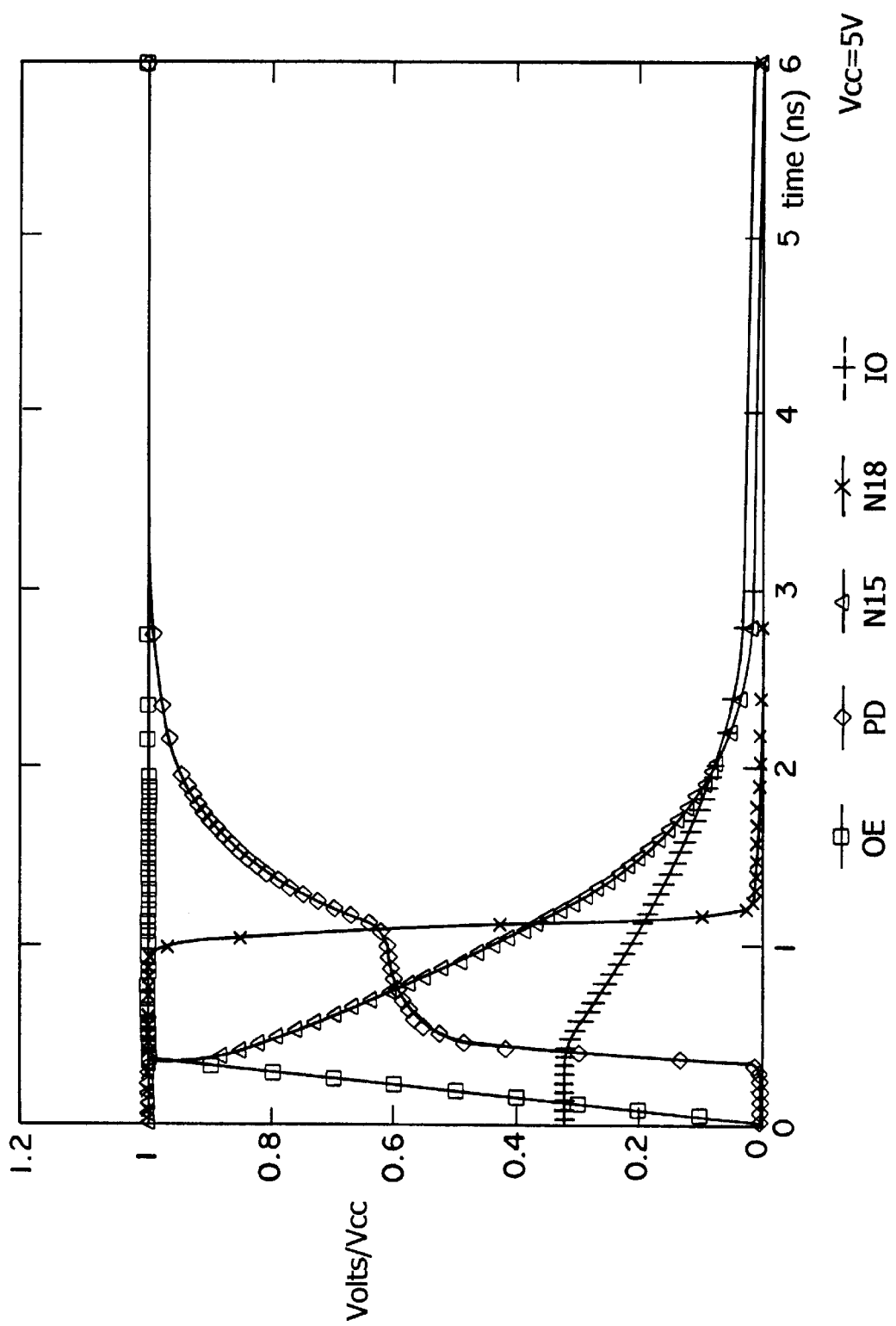
FIG. 6 shows the voltage-time diagram of OE, PD, N3, N7, IO curves of the present circuit when the power source is 5 V and the output is "O".

Next we discuss the high voltage source application with output signal IO to be low. Therefore, pull-up transistor 402 is turned off and push-down transistor 404 is turned on. When data input signal DI is low and output enable signal OE is high, push-down terminal PD is charged to VR-V$_T$ through transistors Q21 and Q22 (V$_T$ is the threshold voltage of transistor Q21). Because the voltage at the gate of transistor Q26 is delayed by delay circuit BL1 and the voltage at the gate of transistor Q25 is not delayed by any delay circuit, as shown in FIG. 6, node PD is charged to the voltage source V$_{CC}$ first by transistor Q25 (because of delay circuit BL1, transistor Q26 is not turned on yet) and then by transistors Q25 and Q26. FIG. 6 also shows the voltage-time diagram of nodes OE, N3, N7, IO when high voltage source is applied and the output is "0".

It is to be explained that when the voltage source is 5 V, input signal $\overline{LV}$ is at high level, so transistor Q24 is turned off for obtaining a longer delay time.

In addition, in the push-down circuit, we do not use the bootstrap circuit. The reason is that the gate-to-source voltage will always remain relatively large (because the source of push-down transistor 404 is connected to the ground).

Figure 7:
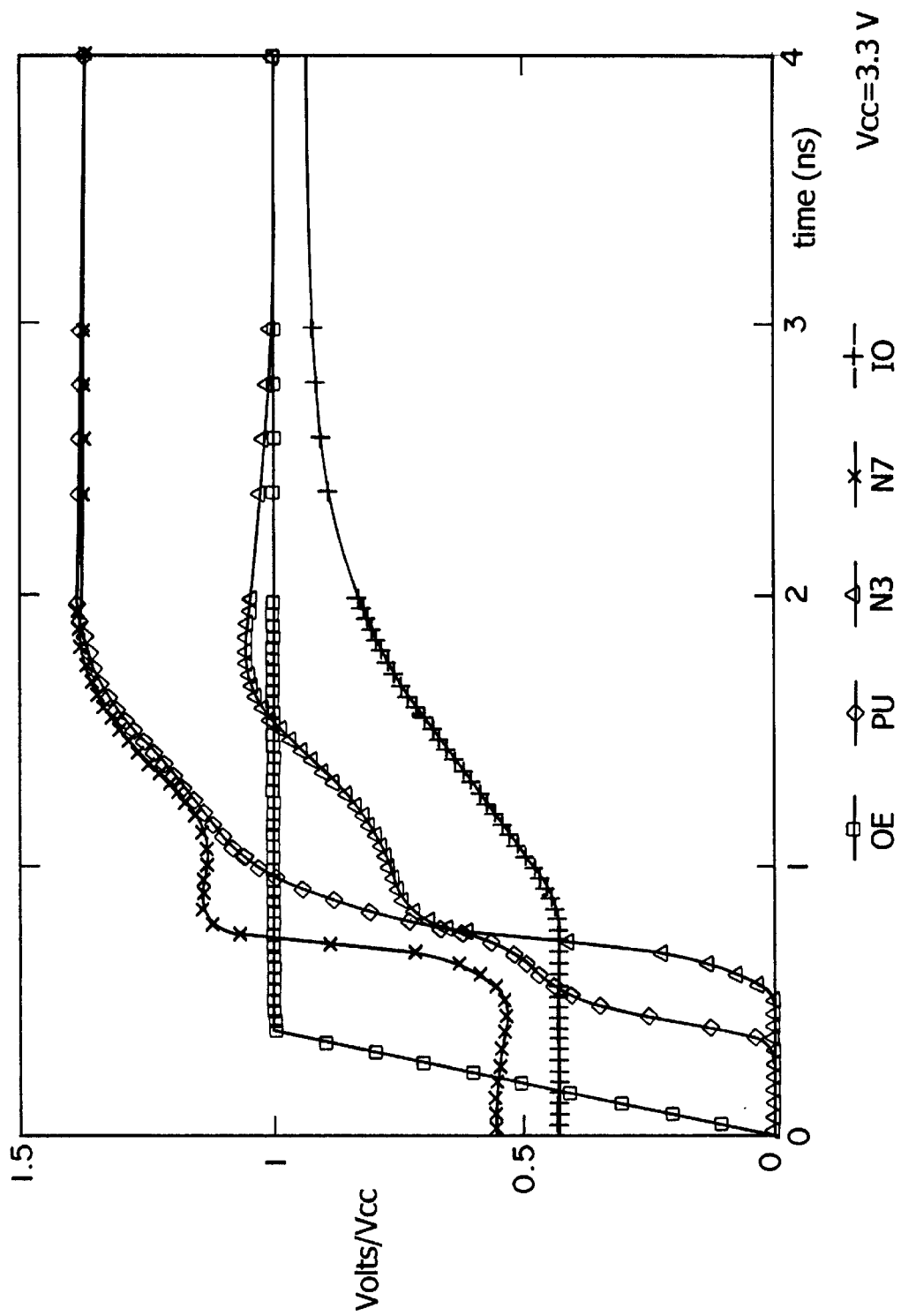
FIG. 7 shows the voltage-time diagram of OE, PU, N3, N7, IO curves of the present circuit when the power source is 3.3 V and the output is "1".

We now discuss the low voltage application with output signal IO to be high. Therefore, pull-up transistor 402 is turned on, and push-down transistor 404 is turned off. Because the voltage source is smaller, with respect to the same circuit, the generated noise is not so serious, so the concern for the output speed is the primary consideration. In the low voltage application, we connect terminal $\overline{LV}$ to the low level voltage (typically to ground). Thus, when the high voltage data is read, gate PU of pull-up transistor 402 is charged to VR-V$_T$ through transistor Q16 (V$_T$ is the threshold voltage of transistor Q12), and at the same time node N3 is quickly charged to voltage source V$_{CC}$ through transistors Q13 and Q14 (owing to the fact that terminal $\overline{LV}$ is connected to ground, transistor Q14 is turned on). Then the voltage at node N7 is raised through capacitor Q15, and the voltage at node N7 is transferred gate PU of pull-up transistor 402 through Q16. FIG.7 shows the voltage-time diagram of nodes OE, PU N3, N7, IO when low voltage source is applied and the output is "1".

Figure 8:
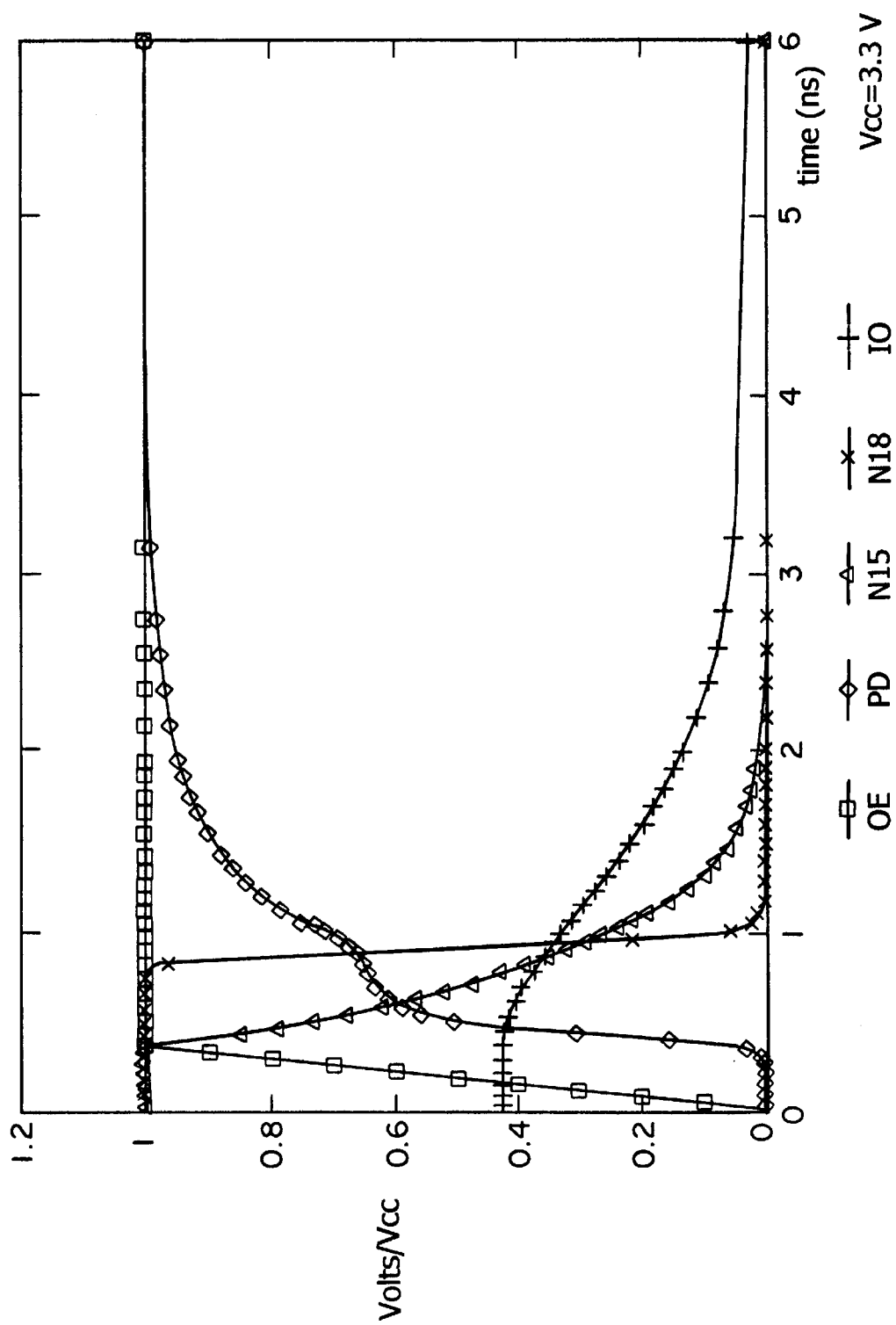
FIG. 8 shows the voltage-time diagram of OE, PD, N3, N7, IO curves of the present circuit when the power source is 3.3 V and the output is "1".

Finally, we discuss the low voltage application when output signal IO is to be low. Therefore, pull-up transistor 402 is turned off and push-down transistor 404 is turned on. FIG. 8 shows the voltage-time diagram of nodes OE, PD N3, N7, IO when low voltage source is applied and the output is "0". The operation of the circuit in the low voltage application is similar to that in the high voltage application, except that transistor Q24 is also turned on. By adjusting the width of transistor Q24, the delay time of delay circuit BL1 is shortened, so the voltage at push-down terminal PD reaches the voltage source V$_{CC}$ faster.

The advantages of the current circuit are numerous. To begin, because the present circuit has the first initial voltage circuit, the initial voltage at pull-up terminal PU (the gate of the pull-up transistor) can be set to a certain value smaller than or equal to the voltage source. The current spikes and the noise will be reduced. Also, the voltage at pull-up terminal PU will gradually increase during the pull-up operation and the slope of the increment is substantially the same as the voltage at the source of pull-up transistor 402 (i.e., output IO of the output buffer), so the variation of the gate-to-source voltage V$_{GS}$ of the pull-up transistor is quite small. In other words, in the latter period of the pull-up operation, pull-up transistor 402 still has high drive capability. In comparison, during pull-up operation, the voltage at the gate of the pull-up transistor of the conventional output buffer stays constant, but the voltage at the source of the pull-up transistor of the conventional output buffer increases continuously. So the gate-to-source voltage V$_{GS}$ decreases gradually, and thus the drive capability of the conventional output buffer is not so good during the latter period of the pull-up operation. Besides, noise is another factor that effects the drive capability: the less the noise, the higher the drive capability. The inductance noise of the present output buffer is quite small, so the drive capability of the present output buffer is better.

Figure 1:
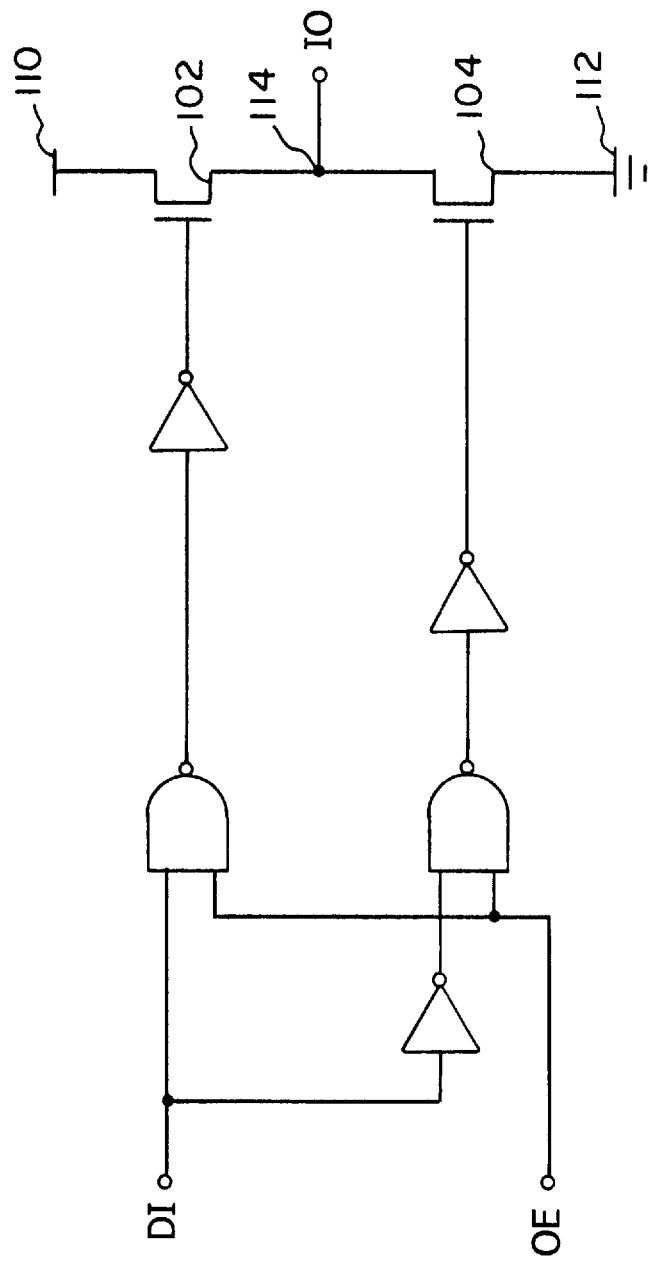
FIG. 1 shows a conventional output buffer circuit.
Figure 2:
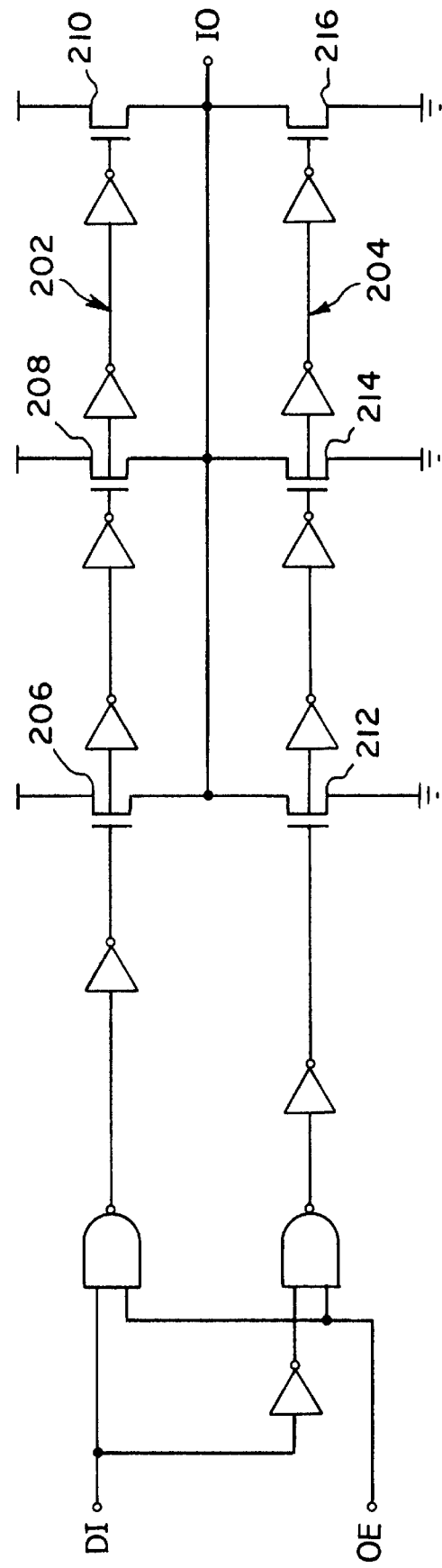
FIG. 2 shows another conventional output buffer circuit.
Figure 3:
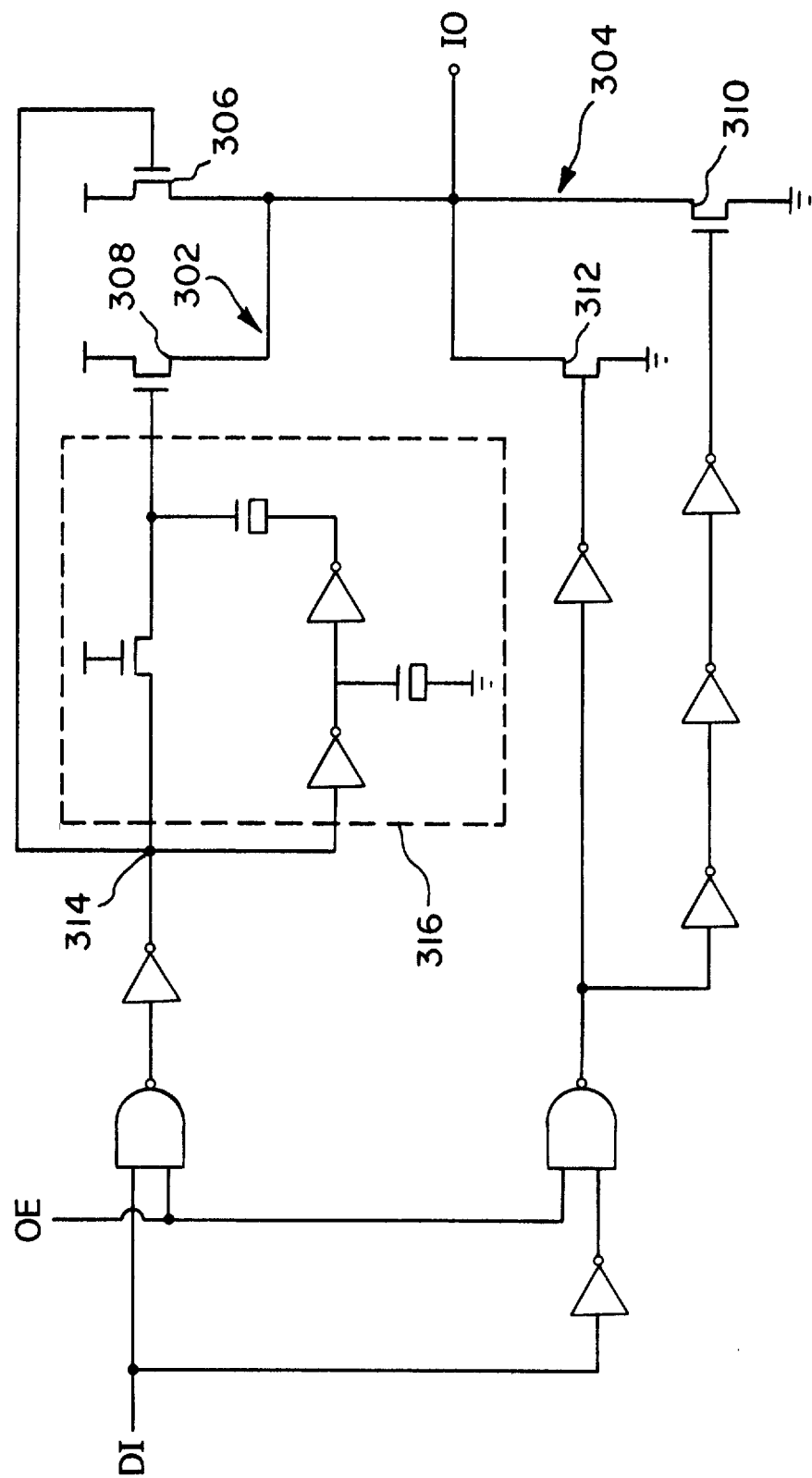
FIG. 3 shows a further conventional output buffer circuit.

Yet another advantage of the present invention is that compared with the output buffers in FIGS. 1 and 2, the present output buffer apparently has faster output capability. In the output buffer in FIG. 3, the output capability can be made faster by the adjustment of the delay time of the delay circuit, but therewith comes another disadvantage: the delay time is hard to control. If the delay time is too short, there still lies the current spikes problem, and if the delay time is too long, the speed is too slow. Also, the present circuit only applies a pull-up transistor and a push-down transistor, the layout area is minimal and the layout is not so complicated. Besides, the width of the pull-up and push-down transistors do not have to be large.

As a final example of the unique properties of this invention, we note that the present output buffer can have two applications: high voltage application and the low voltage application. In the low voltage application, by the use of transistors Q14, in the low voltage application, the voltage at the gate of the pull-up transistor can reach the desired value fast, and by the use of transistor Q24, the voltage at the gate of the push-down transistor can reach the power source fast. Thus, in the low voltage application, the output speed will not substantially slow down.

What is claimed is:

1. An apparatus for buffering output, said apparatus having a data input terminal, a voltage source, a ground and an output terminal, said apparatus comprising:

a pull-up circuit comprising
an input terminal, connected to said data input terminal, for receiving a signal turning on said pull-up circuit;
a pull-up driver having an input terminal, a pull-up terminal and an output, said input terminal and said output of said pull-up driver electrically connected to said voltage source and said output terminal, respectively, said pull-up driver for driving said output terminal to the source voltage; and an initial voltage circuit having a control input, first and second voltage inputs and a voltage output, said control input electrically connected to said input terminal of said pull-up circuit, said first voltage input connected to said voltage source, said second voltage input connected to a reference voltage source, said voltage output electrically connected to said pull-up terminal, said initial voltage circuit for providing an initial voltage to said pull-up terminal and controlled in a loop by the voltage at said pull-up terminal, said initial voltage determined by the reference voltage source, wherein said initial voltage is not greater than said voltage source; and a push-down circuit, electrically connected to ground and to said output terminal;

wherein said initial voltage circuit further has a third voltage input and comprises first and second transistors, said first and second transistors, each having first, second and control terminals, said first, second and control terminals of said first transistor electrically connected to said voltage source, to said first terminal of said second transistor and to said reference voltage source, respectively, said reference voltage source at a voltage not greater than said voltage source, said first, second and control terminals of said second transistor electrically connected to said third voltage input, to said voltage output and to said control input of said initial voltage circuit, respectively.

2. The apparatus of claim 1 wherein said pull-up driver comprises a transistor having first, second and control terminals, said first terminal electrically connected to said voltage source, said second terminal electrically connected to said output, said control terminal electrically connected to said pull-up terminal.

3. The apparatus of claim 1 wherein the voltage at said output terminal reaches 50% of the voltage source within 2 nanoseconds after said pull-up circuit is turned on.

4. An apparatus for buffering output, said apparatus having a data input terminal, a voltage source, a ground and an output terminal, said apparatus comprising:

a pull-up circuit comprising an input terminal, connected to said data input terminal, for receiving a signal turning on said pull-up circuit;

a pull-up driver having an input terminal, a pull-up terminal and an output, said input terminal and said output of said pull-up driver electrically connected to said voltage source and said output terminal, respectively, said pull-up driver for driving said output terminal to the voltage source; and an initial voltage circuit having a control input, first and second voltage inputs and a voltage output, said control input electrically connected to said input terminal of said pull-up circuit, said first voltage input connected to said voltage source, said second voltage input connected to a reference voltage source, said voltage output electrically connected to said pull-up terminal, said initial voltage circuit for providing an initial voltage to said pull-up terminal, said initial voltage determined by the reference voltage source; and a push-down circuit, electrically connected to ground and to said output terminal, wherein said initial voltage circuit further has a third voltage input and comprises first and second transistors, said first and second transistors, each having first, second and control terminals, said first, second and control terminals of said first transistor electrically connected to said voltage source, to said first terminal of said second transistor and to said reference voltage source, respectively, said reference voltage source at a voltage not greater than said voltage source, said first, second and control terminals of said second transistor electrically connected to said third voltage input, to said voltage output and to said control input of said initial voltage circuit, respectively.

5. An apparatus for buffering output, said apparatus having a data input terminal, a voltage source, a ground and an output terminal, said apparatus comprising:

a pull-up circuit comprising an input terminal, connected to said data input terminal, for receiving a signal turning on said pull-up circuit;

a pull-up driver having an input terminal, a pull-up terminal and an output, said input terminal and said output of said pull-up driver electrically connected to said voltage source and said output terminal, respectively, said pull-up driver for driving said output terminal to the voltage source; and an initial voltage circuit having a control input, first and second voltage inputs and a voltage output, said control input electrically connected to said input terminal of said pull-up circuit, said first voltage input connected to said voltage source, said second voltage input connected to a reference voltage source, said voltage output electrically connected to said pull-up terminal, said initial voltage circuit for providing an initial voltage to said pull-up terminal and controlled in a loop by the voltage at said pull-up terminal, said initial voltage determined by the reference voltage source; and a push-down circuit, electrically connected to ground and to said output terminal, wherein the voltage at said pull-up terminal has a slope, the voltage at said output terminal has a slope and the slope of the voltage at said pull-up terminal is substantially the same as the slope of the voltage at said output terminal after the voltage at said pull-up terminal reaches said initial voltage.

6. The apparatus of claim 5 wherein said pull-up driver comprises a transistor having first, second and control terminals, said first terminal electrically connected to said voltage source, said second terminal electrically connected to said output, said control terminal electrically connected to said pull-up terminal.

7. The apparatus of claim 5 wherein the voltage at said output terminal reaches 50% of the voltage source within 2 nanoseconds after said pull-up circuit is turned on.

8. An apparatus for buffering output, said apparatus having a data input terminal, a voltage source, a ground and an output terminal, said apparatus comprising:

a pull-up circuit comprising an input terminal, connected to said data input terminal, for receiving a signal turning on said pull-up circuit, a pull-up driver having an input terminal, a pull-up terminal and an output, said input terminal and said output of said pull-up driver electrically connected to said voltage source and said output terminal, respectively, said pull-up driver for driving said output terminal to the voltage source; and an initial voltage circuit having a control input, first and second voltage inputs and a voltage output, said control input electrically connected to said input terminal of said pull-up circuit, said first voltage input connected to said voltage source, said second voltage input connected to a reference voltage source, said voltage output electrically connected to said pull-up terminal, said initial voltage circuit for providing an initial voltage to said pull-up terminal and controlled in a loop by the voltage at said pull-up terminal, said initial voltage determined by the reference voltage source, and a push-down circuit, electrically connected to ground and to said output terminal, wherein the operation of said pull-up circuit has first and second halves and the pull-up driver has high drive capability during the second half of the operation period; and wherein said initial voltage circuit further has a third voltage input and comprises first and second transistors, said first and second transistors, each having first, second and control terminals, said first, second and control terminals of said first transistor electrically connected to said voltage source, to said first terminal of said second transistor and to said reference voltage source, respectively, said reference voltage source at a voltage not greater than said voltage source, said first, second and control terminals of said second transistor electrically connected to said third voltage input, to said voltage output and to said control input of said initial voltage circuit, respectively.

9. The apparatus of claim 8 wherein said pull-up driver comprises a transistor having first, second and control terminals, said first terminal electrically connected to said voltage source, said second terminal electrically connected to said output, said control terminal electrically connected to said pull-up terminal.

10. The apparatus of claim 6 wherein the voltage at said output terminal reaches 50% of the voltage source within 2 nanoseconds after said pull-up circuit is turned on.

11. An apparatus for buffering output, said apparatus having a data input terminal, a voltage source, a ground and an output terminal, said apparatus comprising:

a pull-up circuit comprising an input terminal, connected to said data input terminal, for receiving a signal turning on said pull-up circuit;

a pull-up driver having an input terminal, a pull-up terminal and an output, said input terminal and said output of said pull-up driver electrically connected to said voltage source and said output terminal, respectively, said pull-up driver for driving said output terminal to the voltage source; and an initial voltage circuit having a control input, first and second voltage inputs and a voltage output, said control input electrically connected to said input terminal of said pull-up circuit, said first voltage input connected to said voltage source, said second voltage input connected to a reference voltage source, said voltage output electrically connected to said pull-up terminal, said initial voltage circuit for providing an initial voltage to said pull-up terminal, said initial voltage determined by the reference voltage source; and a push-down circuit, electrically connected to ground and to said output terminal, wherein said initial voltage circuit further has a third voltage input and said apparatus further comprises a reference voltage circuit having a reference input, a first and a second reference output, said reference input receiving said signal turning on said pull-up circuit a voltage-increasing circuit, having a control input and a voltage output, said voltage output of said voltage-increasing circuit electrically connected to said third voltage input of said initial voltage circuit, said voltage output of said voltage-increasing circuit causing said initial voltage circuit, to increase the voltage at said pull-up terminal from said initial voltage; and a control circuit having an input, a control terminal, and an output, said input electrically connected to said first reference output of said reference circuit, said control terminal electrically connected to said pull-up terminal and said second reference output, and said output of said control circuit electrically connected to said control input of said voltage-increasing circuit, said output of said control circuit for controlling the degree to which said voltage-increasing circuit causes said initial voltage circuit to increase the voltage at said pull-up terminal from said initial voltage, said control circuit responsive to the voltage on said control terminal.

12. The apparatus of claim 11 wherein said voltage-increasing circuit comprises a capacitor having first and second terminals, said first and second terminals electrically connected to said control input and said voltage output of said voltage-increasing circuit, respectively.

13. The apparatus of claim 11 wherein the voltage at said pull-up terminal has a slope, the voltage at said output terminal has a slope and the slope of the voltage increment at said pull-up terminal is substantially the same as the slope of the voltage increment at said output terminal.

14. The apparatus of claim 11 wherein said control circuit comprises a transistor having first, second and control terminals, said first, second and control terminals electrically connected to said input, output and control terminal of said control circuit, respectively.

15. An apparatus for buffering output, said apparatus having a data input terminal, a voltage source, a ground and an output terminal, said apparatus comprising:

a push-down circuit comprising an input terminal, connected to said data input terminal, for receiving a signal turning on said push-down circuit;

a push-down driver having a push-down terminal and an output, said output of said push-down driver electrically connected to said output terminal, said push-down driver for lowering the voltage at said output terminal to the ground voltage;

an initial voltage circuit having a control input, first and second voltage inputs and an output, said control input electrically connected to said input terminal, said first voltage input electrically connected to said voltage source, said second voltage input electrically connected to a reference voltage source, said output of said initial voltage circuit electrically connected to said push-down terminal, said initial voltage circuit for providing an initial voltage to said push-down terminal, said initial voltage determined by the reference voltage source;

a delay circuit, having an input and an output, said input of said delay circuit electrically connected to said input terminal, said delay circuit for delaying signals fed onto said input of said delay circuit; and a voltage-increasing circuit having first and second inputs and an output, said first input of said voltage-increasing circuit electrically connected to said input terminal, said second input of said voltage-increasing circuit electrically connected to said output of said delay circuit, said output of said voltage-increasing circuit electrically connected to said push-down terminal, said voltage-increasing circuit for increasing the voltage on said push-down terminal in response to a signal on said first input of said voltage-increasing circuit and for increasing the rate of the voltage increase on said push-down terminal in response to a signal on said second input of said voltage-increasing circuit; and a pull-up circuit, electrically connected to said voltage source and to said output terminal.

16. The apparatus of claim 15 wherein said push-down driver comprises a transistor having first, second and control terminals, said first, second and control terminals electrically connected to said ground, said output of said push-down driver and said push-down terminal, respectively.

17. The apparatus of claim 15 wherein said initial voltage circuit comprises first and second transistors, said first and second transistors each having first, second and control terminals, said first, second and control terminals of said first transistor electrically connected to said voltage source, said first terminal of said second transistor and said reference voltage source, respectively, said second and control terminals of said second transistor electrically connected to said output and said control input of said initial voltage circuit, respectively, said control input of said initial voltage circuit electrically connected to said input terminal.

18. The apparatus of claim 15 wherein said voltage-increasing circuit comprises first and second transistors, said first and second transistors each having first, second and control terminals, said first, second and control terminals of said first transistor electrically connected to said voltage source, to said first terminal of said second transistor and to said first input of said voltage-increasing circuit, respectively, said second and control terminals of said second transistor electrically connected to said output of said voltage-increasing circuit and to said second input of said voltage-increasing circuit, respectively.

19. The apparatus of claim 15 wherein said delay circuit has an additional input onto which is fed a signal indicating whether said delay circuit is operating at higher or lower voltage, and in response to said signal, said delay circuit effects a longer delay when said apparatus is operating at higher voltage.

20. An apparatus for buffering output, said apparatus having a data input terminal, a voltage source, a ground and an output terminal, said apparatus comprising:

a pull-up circuit comprising
a first input terminal, connected to said data input terminal, for receiving a signal turning on said pull-up circuit;
a pull-up driver having an input, a pull-up terminal and an output, said input of said pull-up driver electrically connected to said voltage source, said output of said pull-up driver electrically connected to said output terminal, said pull-up driver for driving said output terminal to the voltage source;
a first initial voltage circuit having a control input, first, second and third voltage inputs and a voltage output, said control input electrically connected to said first input terminal, said first voltage input electrically connected to said voltage source, said second voltage input electrically connected to a reference voltage source, said voltage output electrically connected to said pull-up terminal, said first initial voltage circuit for providing a first initial voltage to said pull-up terminal, said first initial voltage determined by the reference voltage source;
a reference voltage circuit having a reference input, a first and a second reference output, said reference input receiving said signal for turning on said pull-up circuit;

a voltage-increasing circuit, having a control input and a voltage output, said voltage output of said voltage-increasing circuit electrically connected to said third voltage input of said first initial voltage circuit, said voltage output of said voltage-increasing circuit causing said first initial voltage circuit, to increase the voltage at said pull-up terminal from said first initial voltage; and a control circuit having an input, a control terminal, and an output, said input electrically connected to said first reference output of said reference circuit, said control terminal electrically connected to said pull-up terminal and said second reference output, and said output of said control circuit electrically connected to said control input of said voltage-increasing circuit, said output of said control circuit for controlling the degree to which said voltage-increasing circuit causes said first initial voltage circuit, to increase the voltage at said pull-up terminal from said first initial voltage, said control circuit responsive to the voltage on said pull-up terminal; and a push-down circuit comprising
a second input terminal, connected to said data input terminal, for receiving a signal turning on said push-down circuit;
a push-down driver having a push-down terminal and an output, said output of said push-down driver electrically connected to said output terminal, said push-down driver for lowering the voltage at said output terminal to the ground voltage;
a second initial voltage circuit having a control input, first and second voltage inputs and an output, said control input electrically connected to said second input terminal, said first voltage input electrically connected to said voltage source, said second voltage input electrically connected to said reference voltage source, said output of said second initial voltage circuit electrically connected to said push-down terminal, said second initial voltage circuit for providing a second initial voltage to said push-down terminal, said second initial voltage determined by the reference voltage source;
a delay circuit, having an input and an output, said input of said delay circuit electrically connected to said second input terminal, said delay circuit for delaying signals fed onto said input of said delay circuit; and
a second voltage-increasing circuit having first and second inputs and an output, said first input of said voltage-increasing circuit electrically connected to said second input terminal, said second input of said voltage-increasing circuit electrically connected to said output of said delay circuit, said output of said voltage-increasing circuit electrically connected to said push-down terminal, said second voltage-increasing circuit for increasing the voltage on said push-down terminal in response to a signal on said first input of said voltage-increasing circuit and for increasing the rate of the voltage increase on said push-down terminal in response to a signal on said second input of said voltage-increasing circuit.

* * * * *